(12) United States Patent
Chawla

(10) Patent No.: US 10,868,498 B2
(45) Date of Patent: Dec. 15, 2020

(54) PULSE BLANKING IN AN AMPLIFIER

(71) Applicant: TEXAS INSTRUMENTS INCORPORATED, Dallas, TX (US)

(72) Inventor: Mohit Chawla, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/748,839

(22) Filed: Jan. 22, 2020

(65) Prior Publication Data

US 2020/0162026 A1 May 21, 2020

Related U.S. Application Data

(63) Continuation of application No. 16/133,859, filed on Sep. 18, 2018, now Pat. No. 10,581,382.

(30) Foreign Application Priority Data

Jun. 7, 2018 (IN) .............................. 201841021304

(51) Int. Cl.
*H03F 3/38* (2006.01)
*H03F 1/02* (2006.01)
*H03F 3/217* (2006.01)
*H03K 5/24* (2006.01)
*H03K 19/20* (2006.01)
*H03K 5/00* (2006.01)

(52) U.S. Cl.
CPC ........... *H03F 1/0211* (2013.01); *H03F 3/217* (2013.01); *H03K 5/24* (2013.01); *H03K 19/20* (2013.01); *H03F 2200/129* (2013.01); *H03F 2200/51* (2013.01); *H03K 2005/00078* (2013.01)

(58) Field of Classification Search
CPC ......................................................... H03F 3/38
USPC ........................................ 330/10, 251, 207 A
See application file for complete search history.

(56) References Cited

U.S. PATENT DOCUMENTS

| 5,521,550 | A | 5/1996 | Doak | |
|---|---|---|---|---|
| 6,342,791 | B1 | 1/2002 | Ichikawa et al. | |
| 7,567,136 | B2 * | 7/2009 | Osvaldella | H03K 3/0315 331/177 R |
| 2012/0280726 | A1 * | 11/2012 | Colombo | H02M 1/08 327/141 |
| 2016/0004510 | A1 * | 1/2016 | Haddad | H03K 3/84 708/255 |
| 2017/0070200 | A1 * | 3/2017 | Chang | H03K 5/1515 |

OTHER PUBLICATIONS

Lee G H, Glitch Protection Circuit Comprises Four Delay Blocks (Year: 2003).*

* cited by examiner

*Primary Examiner* — Henry Choe
(74) *Attorney, Agent, or Firm* — John R. Pessetto; Charles A. Brill; Frank D. Cimino

(57) ABSTRACT

A circuit includes a comparator to compare an analog signal to a ramp signal to generate a pulse width modulated output signal and a driver to generate control signals for a plurality of power transistors. A pulse blanking circuit receives the pulse width modulated output signal. For each pulse of the pulse width modulated output signal, the pulse blanking circuit, responsive to a width of the pulse being greater than a threshold, passes the pulse to the driver. Responsive to the width of the pulse being less than the threshold, the pulse blanking circuit prevents the pulse from being passed to the driver.

5 Claims, 4 Drawing Sheets

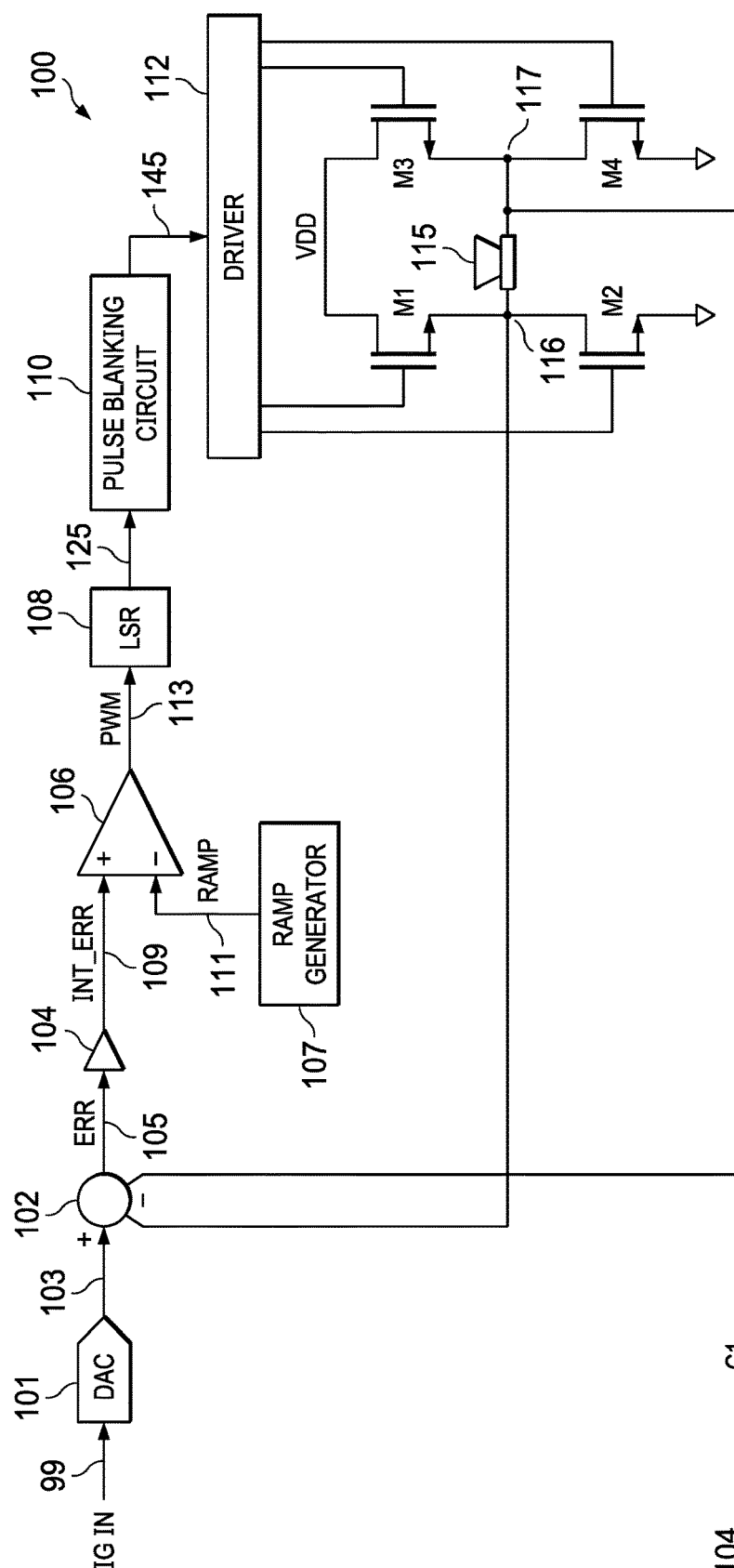
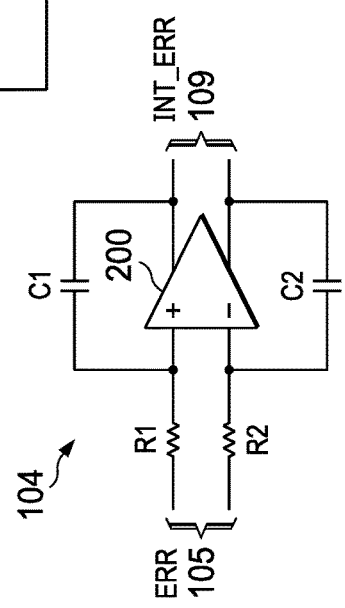
FIG. 1
FIG. 2

PULSE BLANKING IN AN AMPLIFIER

CROSS-REFERENCE TO RELATED APPLICATIONS

This continuation application claims priority to U.S. patent application Ser. No. 16/133,859, filed Sep. 18, 2018, which application claims priority to India Provisional Application No. 201841021304, filed Jun. 7, 2018, both of which are hereby incorporated herein by reference in their entirety.

BACKGROUND

Class D amplifiers are used in a variety of applications such as for driving a speaker. Class D amplifiers provide better efficiency compared to Class A, Class B, or Class AB amplifiers. However, at low power levels, Class D switching losses due to the inherent capacitances of the power transistors charging and discharging can be significant, particularly during idle channels in audio applications (e.g., when no appreciable audio signal is to be amplified and provided to a speaker). For audio applications, audio signals often have a relatively high peak-to-average ratio. Often, the input audio signal has a relatively low amplitude. Further, a switching frequency tone is often present in Class D output. The tone degrades Class-D out-of-band performance and can inter-modulate with digital-to-analog converter switching frequency and degrade in-band noise performance as well.

SUMMARY

A circuit includes a comparator to compare an analog signal to a ramp signal to generate a pulse width modulated output signal and a driver to generate control signals for a plurality of power transistors. A pulse blanking circuit receives the pulse width modulated output signal. For each pulse of the pulse width modulated output signal, the pulse blanking circuit, responsive to a width of the pulse being greater than a threshold, passes the pulse to the driver. Responsive to the width of the pulse being less than the threshold, the pulse blanking circuit prevents the pulse from being passed to the driver.

BRIEF DESCRIPTION OF THE DRAWINGS

For a detailed description of various examples, reference will now be made to the accompanying drawings in which:

FIG. 1 illustrates an amplifier used to drive a load in accordance with an example.

FIG. 2 shows an example of an error integrator usable in the amplifier of FIG. 1.

DETAILED DESCRIPTION

Figure 3:
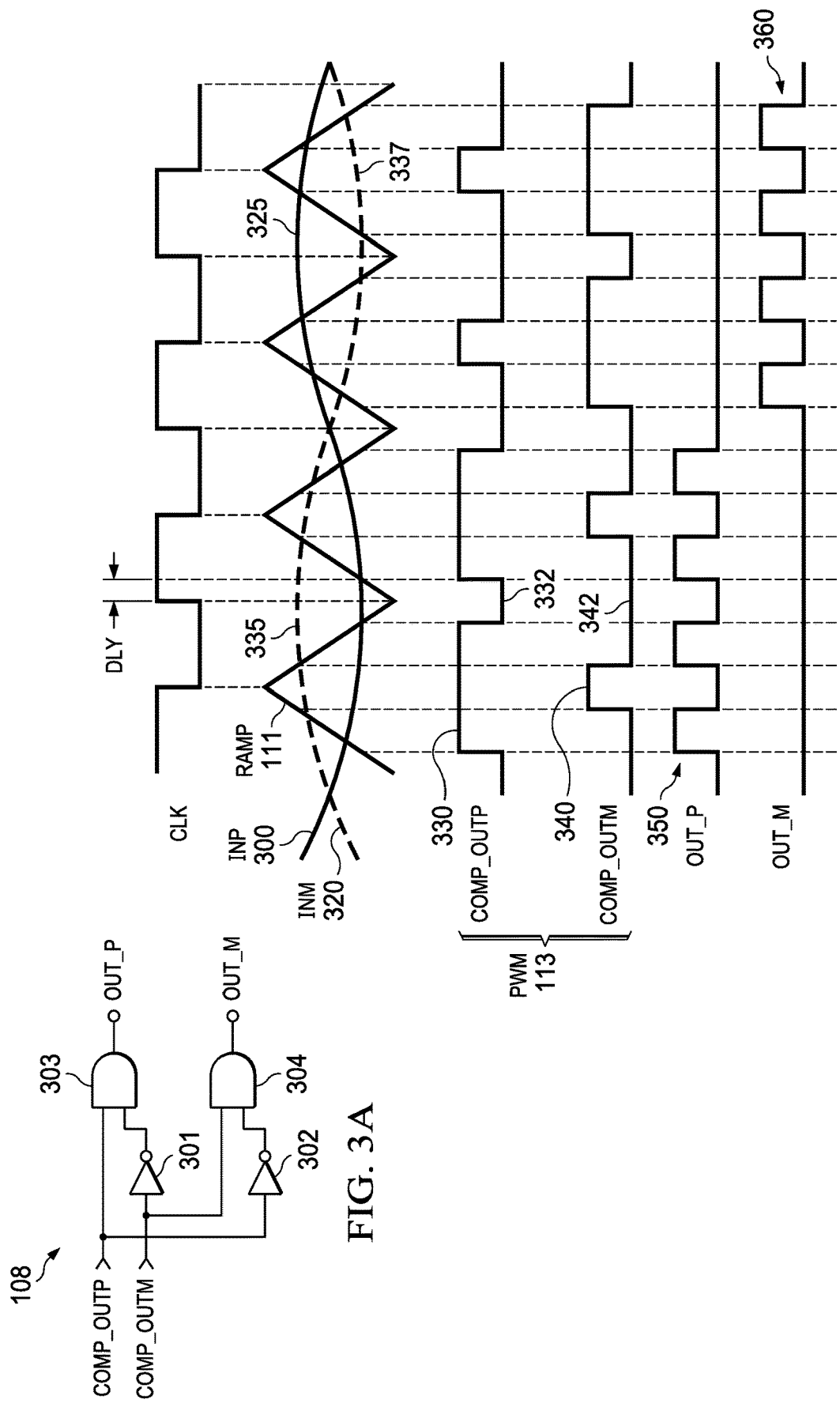
FIG. 3A shows an example implementation of a low side recycle circuit.
FIG. 3B shows waveforms of the operation of a low side recycle circuit included in the amplifier of FIG. 1.

An amplifier (e.g., a Class D amplifier) is described herein that reduces switching losses by blanking pulse width modulated pulses that are narrower than a defined threshold. The threshold generally corresponds to a low input signal amplitude. Narrow pulses generally correspond to low levels of an error signal and operating the amplifier at low error signal levels can be inefficient. By blanking the pulses used to drive the amplifier's power transistors, the amplifier is effectively turned off at low error signal levels thereby mitigating the inefficiency issues. Once the integrated error level exceeds a threshold, the pulses are again permitted to be used to drive the amplifier's power transistors.

FIG. 1 shows an example of an amplifier 100. The example amplifier of FIG. 1 implemented based on a Class D amplifier architecture. The amplifier of FIG. 1 includes a digital-to-analog converter (DAC) 101, a subtractor 102, an error integrator 104, a comparator 106, a ramp generator 107, a low side recycle (LSR) circuit 108, a pulse blanking circuit 110, a driver 112, and a plurality of transistors M1, M2, M3, and M4. The analog signals in FIG. 1 (signal 103, error signal (ERR) 105, and the integrated error (INT_ERR) signal 109 are implemented in some examples as differential signals, although they can be single-ended in other examples.

The transistors M1-M4 comprise power transistors and are controlled by control signals from driver 112. The driver 112 asserts the control signals to turn the various transistors M1-M4 on and off to thereby drive a load 115. In the example of FIG. 1, the load 115 is shown as a speaker and thus the amplifier 100 in this example is an audio amplifier. However, the load 115 can be other than a speaker in other examples. The transistors M1-M4 in this example comprise n-type metal oxide semiconductor field effect transistors (NMOS), but can be implemented as p-type metal oxide semiconductor field effect transistors (PMOS), bipolar junction transistors (n-type or p-type), or other types of transistors in other examples. The drains of M1 and M3 are coupled together and coupled to a positive supply voltage node (VDD). The source of M1 is coupled to the drain of M2 and the source of M3 is coupled to the drain of M4. The sources of M2 and M4 are coupled to a ground node.

The load 115 is coupled to the node 116 interconnecting M1 and M2 and to the node 117 interconnecting M3 and M4 as shown. Nodes 116 and 117 provides the output voltage from the amplifier 100. The driver 112 asserts control signal to each of the gates of M1-M4 to individually turn on and off each respective transistor. For example, the driver 112 turns on M1 and M4 to cause node 116 to be approximately VDD while node 117 is approximately ground. In alternate state, the driver 112 turns on M3 and M2 to cause node 117 to be approximately VDD while node 116 is approximately ground. M1 and M2 are not turned on concurrently and M3 and M4 are not turned on concurrently.

The DAC 101 receives a digital input signal (DIG IN) 99 and converts the digital input signal to an analog signal equivalent (signal 103). The analog signal 103 is provided to subtractor 102. The output voltage from nodes 116 and 117 is also provided to subtractor 102. Subtractor 102 subtracts the output voltage across nodes 116 and 117 from the analog signal 103 to produce an error signal (ERR) 105. The magnitude of the error signal 105 is a function of the difference between signal 103 and the amplifier's output voltage on node 116. The amplifier 100 reacts to the error signal 105 by controlling the states of the transistors M1-M4 to reduce the magnitude of the error signal 105 towards zero.

The error integrator 104 integrates the error signal 105 over time and produces a voltage that is a function of the error signal over time. FIG. 2 shows an example of an error integrator 104. The example error integrator 104 includes resistors R1 and R2, capacitors C1 and C2, and an operational amplifier 200. The error signal 105, which in FIG. 2 is shown as a differential signal, is provided to resistors R1 and R2 as shown, and the output of the operational amplifier 200 is the integrated error signal 109 (also a differential signal). Integrated error signal 109 comprises a differential voltage that is proportional to the time integral of the input error signal 105.

Referring back to FIG. 1, the comparator 106 compares the integrated error signal 109 to a ramp signal 111 (RAMP) generated by ramp generator 107. In some examples, the ramp generator 107 is implemented as a capacitor, a current source and multiple switches. The switches are controlled to cause a constant current to charge the capacitor during a charge phase and then to discharge the capacitor during a discharge phase. The rate of change of voltage across the capacitor is linear (a ramp) and the capacitor's increases linearly during the charge phase and then decreases linearly during the discharge phase. The switches are controlled by a clock signal to cause the ramp generator 107 to produce a periodic ramp signal 111. Responsive to the integrated error signal 109 being greater than the ramp signal 111, the comparator's output signal 113 is forced high, while responsive to the integrated error signal 109 being smaller than the ramp signal 111, the comparator's output signal 113 is forced low. The comparator's output signal 113 is thus a PWM output signal and through the LSR 108, pulse blanking circuit 110 and driver 112 is used to operate the transistors M1-M4.

FIG. 3A shows an example implementation of LSR 108. In this example, LSR 108 includes inverters 301 and 302 and AND gates 303 and 304. Inverter 301 receives a signal shown as COMP_OUTM and inverter 302 receives a signal shown as COMP_OUTP. The COMP_OUTP and COMP_OUTM signals represent the differential PWM output signal 113 generated by the comparator 106, and OUTP and OUTM signals from AND gates 303 and 304 represent the LSR's output 125. AND gate 303 logically ANDs together COMP_OUTP with the inverted version of COMP_OUTM and AND gate 304 logically ANDs together COMP_OUTM with the inverted version of COMP_OUTP. The LSR 108 receives the PWM output signal 113 from the comparator 106 and generates an output pulse signal 125 (OUT_P and OUT_M) to the pulse blanking circuit 110.

FIG. 3B shows waveforms of signals pertaining to the operation of the LSR 108. The ramp signal 111 is generated using a clock signal (CLK). The rising and falling edges of CLK coincide with the transition points in the ramp signal 111. Signals INP 300 and INM 320 are examples of the differential integrated error signal 109 from the error integrator 104. As INP falls, INM rises, and vice versa as shown. The ramp signal 111 also is illustrated. COMP_OUTP is high (e.g., as shown at 330) responsive to the ramp signal 111 being larger than INP 300 and COMP_OUTP is low (e.g., as shown at 332) responsive to the ramp signal 111 being smaller than INP 300. As such, the width of the pulses of COMP_OUTP are larger when INP 300 is lower than when INP 300 is higher (e.g., as indicated at 325).

Similarly, COMP_OUTM is high (e.g., as shown at 340) responsive to the ramp signal 111 being larger than INM 340 and COMP_OUTM is low (e.g., as shown at 342) responsive to the ramp signal 111 being smaller than INM 320. The width of the pulses of COMP_OUTM are smaller when INM 320 is higher (e.g., as indicated at 335) than when INM 320 is lower (e.g., as indicated at 337). As such, the widths of the pulses of COMP_OUTP vary inversely with respect to the widths of the pulses of COMP_OUTM.

The LSR 108 implements the truth table below. OUT_P and OUT_M represent the output signal 125 from the LSR as noted above.

| Truth Table for LSR 108 | | | |
|---|---|---|---|
| COMP_OUTP | COMP_OUTM | OUT_P | OUT_M |
| 0 | 0 | 0 | 0 |
| 0 | 1 | 0 | 1 |
| 1 | 0 | 1 | 0 |
| 1 | 1 | 0 | 0 |

As shown, OUT_P is a logic 1 only when COMP_OUTP is a 1 and COMP_OUTM is a 0. OUT_M is a logic 1 only when COMP_OUTP is a 0 and COMP_OUTM is a 1. As such, OUT_P is a series of pulses as shown at 350 when the width of the COMP_OUTP pulses is wider than the width of the COMP_OUTM pulses, and OUT_M is a series of pulses as shown at 360 when the width of the COMP_OUTM pulses is wider than the width of the COMP_OUTP pulses. M2 and M4 are turned on when OUT_P and OUT_M are 0. M2 and M3 are turned on when OUT_P is 0 and OUTM is 1. M1 and M4 are turned on when OUT_P is 1 and OUT_M is 0.

The OUT_P and OUT_M signals are provided to the pulse blanking circuit 110 which, responsive to a width of a pulse being greater than a threshold, passes the pulse to the driver 112. However, responsive to the width of the pulse being less than the threshold, the pulse blanking circuit 110 prevents the pulse from being passed to the driver 112.

Figure 4:
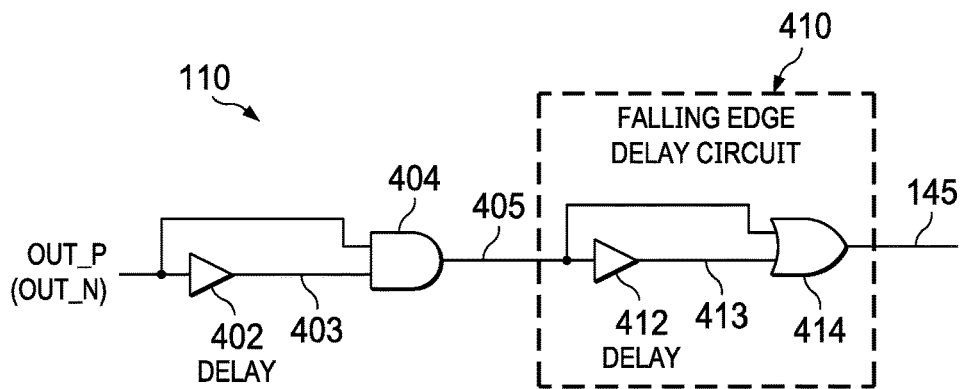
FIG. 4 shows an example of the pulse blanking circuit included in the amplifier of FIG. 1.

FIG. 4 shows an example implementation of the pulse blanking circuit 110. The pulse blanking circuit 110 in this example includes delay elements 402 and 412 as well as logic gates 404 and 414. Delay 412 and logic gate 414 form a falling edge delay circuit 410. In this example, logic gate 404 comprises an AND gate and logic gate 414 comprises an OR gate, and referred to herein as AND gate 404 and OR gate 414, respectively. Logic gates 404 and 414 can be implemented as other than AND and OR gates, respectively, in other examples. The output of AND gate 404 is signal 405 and the output of OR gate 413 is signal 145. The delay elements 402, 412 comprise an even number of serially-connected inverters or any other type of circuit that generates an output signal that matches the input signal but delayed by a defined time period. The output signal from delay element 402 is signal 403 and the output signal from delay element 412 is signal 413. The delay time period of delay element 402 approximately matches that of the delay element 412. The pulse blanking circuit 110 may comprise multiple instances of the circuit shown in FIG. 4—one for OUT_P and another for OUT_M.

Figure 5:
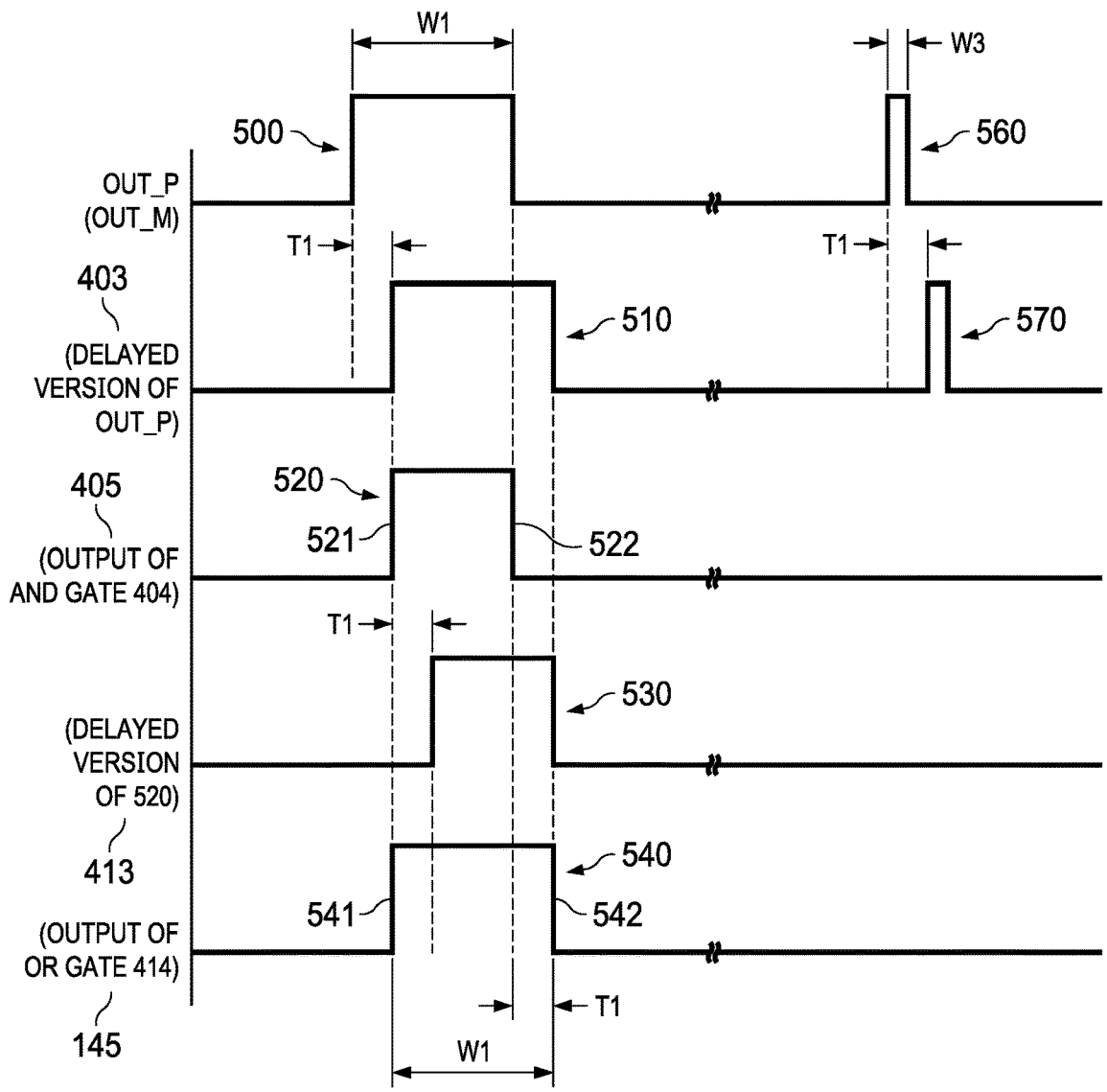
FIG. 5 shows waveforms of the operation of the pulse blanking circuit of FIG. 4.

The input signal (e.g., OUT_P) to the pulse blanking circuit 110 is provided to both the delay 402 and to the logic gate 404. The output signal 403 of the delay element 402 is a delayed version of the input signal. FIG. 5 shows example waveforms illustrating the operation of the pulse blanking circuit 110. Reference numeral 500 shows a single pulse of OUT_P and reference numeral 510 shows a delayed version of the pulse as signal 403 from the delay element 402. The amount of the time delay (T1) corresponds to the time delay implemented by the delay element 402. The AND 404 receives both the original pulse 500 and the delayed pulse 510. Reference numeral 520 represents the output pulse of the AND gate on signal 405 and thus is logic high responsive to both pulses 500 and 510 being high. T The pulse blanking circuit 110 is configured to pass an input pulse (e.g., pulse 500) through to its output and to driver 112 responsive to the width of the input pulse being greater than a threshold. The threshold is the time delay T1 implemented by the delay element 402. As long as the width W1 of the input pulse 500 is larger than the time delay (threshold) T1, both pulse 500 and the delayed pulse 510 will be logic high at the same time and thus the output signal 405 of the AND gate 404 will also be a logic high. The width of pulse 520 generated by the AND gate 404 is W2, which is less than W1. The width of the output pulse on signal 145 from the pulse blanking circuit 110, however, should be W1.

The falling edge delay circuit 410 performs the function of receiving pulse 520 from the AND gate 404 and generating an output pulse 540 whose rising edge 541 is coincident with the rising edge 521 of pulse 520 and whose falling 542 occurs past the falling edge 522 of pulse 520 by a period of time equal to T1. The delay element 412 of the falling edge delay circuit 410 receives pulse 520 on signal 405 from the AND gate 404 and generates a signal 413 to the OR gate 414 that includes a pulse 530 that is delayed version of pulse 520. The amount of the delay also is T1. The output signal 145 from OR gate 414 is logic high responsive to at least one of its inputs being logic high. OR gate 414 OR's together signals 405 and 413 to produce pulse 540 as shown. The resulting output pulse 540 from the pulse blanking circuit 110 has a width of W1 which is the same as the width of pulse 500. As such, the pulse 540 that is provided to the driver 112 on signal 145 has the same width as the input pulse generated by the LSR 108 but is slightly delayed in time due to the time delay T1 of delay element 402. This time delay in the pulses provided to the driver 112 do not impact the performance of the amplifier 100. Pulse 500 passes through the pulse blanking circuit 110 to the driver because its width W1 is larger than the threshold implemented by the delay element 402.

Referring still to FIG. 5, another example is shown of a pulse 560 as the OUT_P signal. The width W3 of pulse 560, however, is less than T1. As such, by the time the delayed pulse 570 is generated by delay element 402, the falling edge of pulse 560 has already occurred. Accordingly, the output signal 405 of AND gate 404 does not become logic high and the output signal of OR gate 414 remains at a logic low level. The pulse blanking circuit 110 thus blanks pulse 560 from reaching the driver 112.

Figure 6:
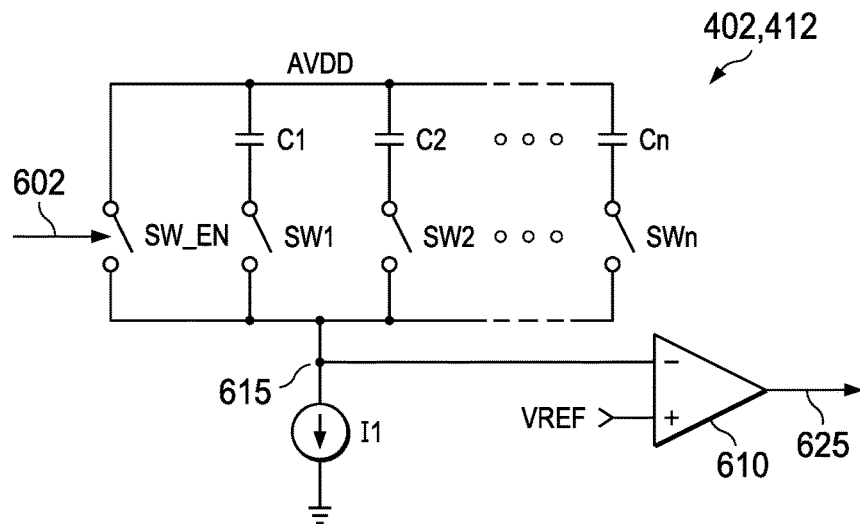
FIG. 6 shows an example of analog delay element usable in the pulse blanking circuit.

FIG. 6 shows an example implementation of either or both of the delay elements 402 and 412. This example implementation comprises an analog delay element and includes capacitors C1, C2, ..., Cn. A corresponding switch (e.g., a transistor) is coupled to each capacitor. Thus, SW1 is coupled to C1, while SW2 ... SWn are coupled to C2 ... Cn, respectively, as shown. The switch labeled as SW_EN is an enable switch and is controlled by the input signal 602 which is the signal to be delayed by the delay element. The switches SW_EN, SW1, SW2, ..., SWn are coupled together and to a current source I1 and to an input of a comparator 610. A reference voltage VREF is coupled the other input to comparator 610. Switch SW_EN is normally closed (on) which causes the voltage on node 615, which is provided to the negative input of comparator 610, to be the supply voltage AVDD provided to the capacitors C1-Cn. The output signal 625 of comparator 610 is logic low as VREF is selected to be smaller than AVDD. The voltage drop across the capacitors is zero due to the short circuit caused by SW_EN being closed.

Upon receipt of a rising edge of a signal to be delayed on signal 602, switch SW_EN is opened (turned off) which, in turn, causes the capacitors to charge due to the constant current from current source I1. The capacitors C1-Cn that charge are only those capacitors whose corresponding switches SW1-SWn are closed and those switches are independently configured to implement a desired time delay. The voltage across those capacitors C1-Cn whose switches SW1-SWn are closed increases due to the constant current from current source I1. As one plate of each capacitor C1-Cn is coupled to a fixed voltage AVDD, the voltage on the opposing plate which is coupled to node 615 decreases, and decreases at an approximately linear rate that is a function of the value of the sum of the capacitances and the magnitude of the current from current source I1. Thus, the rate of change of the voltage on node 615 can be controlled by selective closure of switches SW1-SWn. In one example, the more switches SW1-SWn that are closed, the longer will it take for the voltage on node 615 to drop below the level of VREF. Once the voltage on node 615 falls below VREF, the output signal 625 of comparator 610 is forced high. Once the input signal 602 experiences a falling edge, enable switch SW_EN is closed which forces the voltage on node 615 back to AVDD and the output 625 of the comparator 610 becomes logic low again.

The time delay between the time that the input signal experiences a rising edge to the time that the output signal experiences a rising edge (i.e., the time delay of the delay element 402, 412) is controlled selection of an appropriate number of switches SW1-SWn. The capacitance values of the capacitors C1-Cn may all be the same or two or more the capacitors may have different capacitance values.

Figure 7:
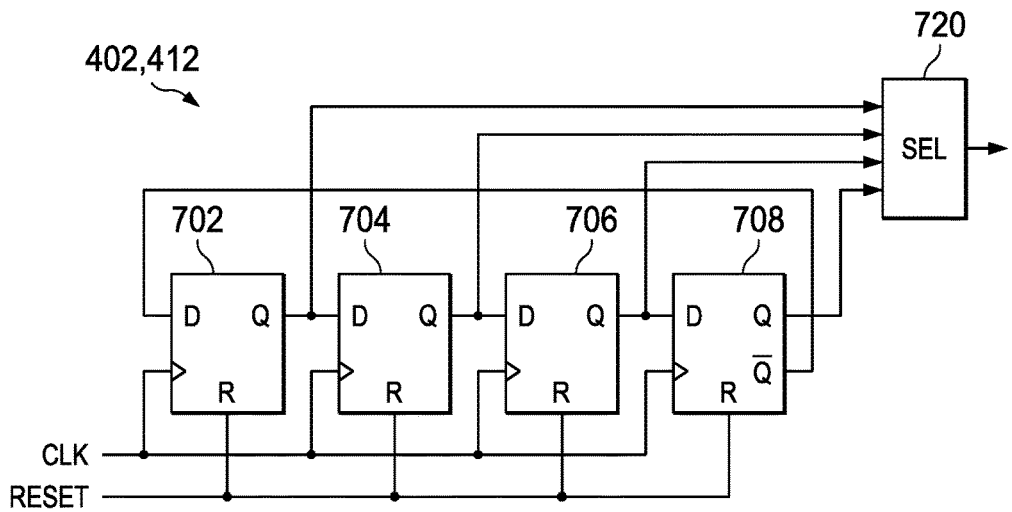
FIG. 7 shows an example of counter usable as a delay element in the pulse blanking circuit.

FIG. 7 shows an example of delay elements 402 and 412 as comprising counter. The counter may comprise a Johnson counter or other suitable counter. In this example, the counter includes a series of flip-flops 702, 704, 706, and 708. The Q output of flip-flop 702 is provided to the D input of flip-flop 704. The Q output of flip-flop 704 is provided to the D input of flip-flop 706. The Q output of flip-flop 706 is provided to the D input of flip-flop 708, and the Qbar output of flip-flop 708 is provided to the D input of flip-flop 702. The reset signal (RESET) shown in FIG. 7 resets the flip-flops. The clock signal (CLK) has a frequency, and period of CLK defines the blanking resolution.

Figure 8:
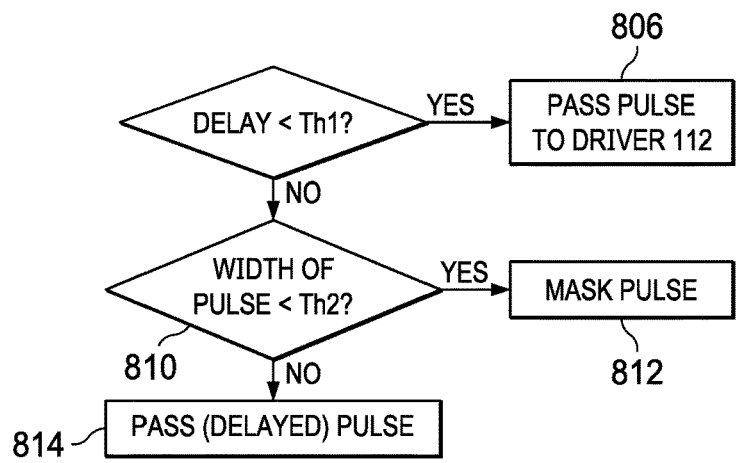
FIG. 8 shows a method of operation of the amplifier in accordance with an example.

FIG. 8 is a flow chart of a method in accordance with an example. At 804, the method includes determining whether the delay between a rising edge of CLK and a rising edge of COMP_OUT (DLY in FIG. 3B) is less than a threshold (Th1). The size of the threshold Th1 is configured to identify pulses certainly have widths wide enough that they will not be blanked by pulse blanking circuit 110. If the delay is less than Th1, the pulse is passed through to driver 112. If the delay is greater than Th1, then the method includes determining (810) whether the pulse width is less than a different threshold Th2. If the pulse width is less than Th2, then at 812 the pulse is masked at 812. Pulse blanking circuit performs this operation. If, however, the pulse width is greater than Th2, then the pulse is passed through at 814 to the driver 112 as described above.

In this description, the term "couple" or "couples" means either an indirect or direct wired or wireless connection. Thus, if a first device couples to a second device, that connection may be through a direct connection or through an indirect connection via other devices and connections.

"Approximately" refers to a value that is the same as, or within plus or minus 10% of another value or range of values.

Modifications are possible in the described embodiments, and other embodiments are possible, within the scope of the claims.

What is claimed is:

1. A circuit, comprising:
   a first delay element coupled to receive an input pulse, the input pulse having a width;
   a first logic gate including first and second inputs, the first input coupled to an output of the first delay element and the second input coupled to receive the input pulse;
   a second delay element coupled to an output of the first logic gate; and
   a second logic gate including third and fourth inputs, the third input coupled to an output of the second delay element and the fourth input coupled to the output of the first logic gate;
   wherein the first logic gate comprises an AND gate and the second logic gate comprises an OR gate.

2. The circuit of claim 1, wherein each of the first and second delay elements implements approximately a same time delay.

3. The circuit of claim 1, wherein at least one of the first and second delay elements includes a counter.

4. The circuit of claim 1, wherein at least one of the first and second delay elements includes an analog delay circuit.

5. The circuit of claim 4, wherein the analog delay circuit includes:
   a plurality of capacitors;
   a plurality of transistor switches, each transistor switch coupled to a respective capacitor;
   an enable switch;
   a current source device coupled to the enable transistor switch and each combination of transistor switch and respective capacitor; and
   a comparator including first and second inputs, the first input coupled to the enable switch and each combination of transistor switch and respective capacitor, and the second input coupled to receive a reference voltage.

* * * * *